US 10,466,931 B2

(12) United States Patent
Kim et al.

(10) Patent No.: US 10,466,931 B2
(45) Date of Patent: Nov. 5, 2019

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Chang Hyun Kim, Seoul (KR); Jaeil Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 23 days.

(21) Appl. No.: 15/996,770

(22) Filed: Jun. 4, 2018

(65) Prior Publication Data

US 2019/0220227 A1  Jul. 18, 2019

(30) Foreign Application Priority Data

Jan. 18, 2018  (KR) .................. 10-2018-0006509

(51) Int. Cl.
*G06F 12/00* (2006.01)
*G06F 3/06* (2006.01)

(52) U.S. Cl.
CPC .......... *G06F 3/0659* (2013.01); *G06F 3/0604* (2013.01); *G06F 3/0634* (2013.01); *G06F 3/0656* (2013.01); *G06F 3/0673* (2013.01)

(58) Field of Classification Search
CPC .................................................. G11C 3/0659
USPC ............................................................ 711/1
See application file for complete search history.

(56) References Cited

U.S. PATENT DOCUMENTS

| 2011/0102066 A1* | 5/2011 | Jin | ........................... | G11C 5/04 327/524 |
| 2012/0250433 A1* | 10/2012 | Jeon | ......................... | G11C 8/18 365/193 |
| 2013/0212329 A1* | 8/2013 | Saito | .................... | G11C 7/1072 711/105 |
| 2013/0339821 A1* | 12/2013 | Cordero | .............. | G06F 11/1666 714/773 |
| 2013/0346684 A1* | 12/2013 | Bains | .................. | G11C 11/4096 711/105 |

FOREIGN PATENT DOCUMENTS

KR  1020170050057 A  5/2017

* cited by examiner

*Primary Examiner* — Min Huang
(74) *Attorney, Agent, or Firm* — William Park & Associates Ltd.

(57) ABSTRACT

A semiconductor device includes an operation control circuit and a mode register activation signal generation circuit. The operation control circuit generates a chip identification storage control signal, a selection identification storage control signal, and a mode register set signal in response to an external set signal and a command. The mode register activation signal generation circuit generates a chip identification and a selection identification in response to the chip identification storage control signal and the selection identification storage control signal. The mode register activation signal generation circuit also generates a mode register activation signal for controlling a mode register set operation in response to the mode register set signal when the chip identification is identical to the selection identification.

20 Claims, 11 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2018-0006509, filed on Jan. 18, 2018, which is incorporated herein by reference in its entirety.

BACKGROUND

1. Technical Field

Embodiments of the present disclosure relate to semiconductor devices and semiconductor systems including the same and, more particularly, to semiconductor devices executing a mode register set operation and semiconductor systems including the semiconductor devices.

2. Related Art

In semiconductor systems, memory controllers may set information (e.g., column address strobe (CAS) latency, a burst length, or the like) that is necessary for operating of semiconductor devices before controlling the operations of the semiconductor devices. The information necessary for operations of the semiconductor devices may be stored in a mode register, and an operation of setting the information necessary for operations of the semiconductor devices may be referred to as a mode register set operation.

SUMMARY

According to an embodiment, a semiconductor device includes an operation control circuit and a mode register activation signal generation circuit. The operation control circuit generates a chip identification storage control signal, a selection identification storage control signal, and a mode register set signal in response to an external set signal and a command. The mode register activation signal generation circuit generates a chip identification and a selection identification in response to the chip identification storage control signal and the selection identification storage control signal. The mode register activation signal generation circuit also generates a mode register activation signal for controlling a mode register set operation in response to the mode register set signal when the chip identification is identical to the selection identification.

According to another embodiment, a semiconductor device includes a first storage circuit, a second storage circuit, and a mode register activation control circuit. The first storage circuit stores a latched address in response to a chip identification storage control signal and outputs the latched address stored therein as a chip identification. The second storage circuit stores the latched address in response to a selection identification storage control signal and outputs the latched address stored therein as a selection identification. The mode register activation control circuit generates a mode register activation signal from a mode register set signal in response to a comparison signal which is enabled when the chip identification is identical to the selection identification.

According to yet another embodiment, a semiconductor system includes a controller and a semiconductor module. The controller outputs a first external set signal, a second external set signal, a command, and an address. The semiconductor module includes a first electronic chip and a second electronic chip that execute mode register set operations in response to the first external set signal, the second external set signal, the command, and the address from the controller. The first electronic chip includes a first mode register activation signal generation circuit. The first mode register activation signal generation circuit generates a first chip identification and a first selection identification in response to a first chip identification storage control signal, generated from the first external set signal, and a first selection identification storage control signal, generated from the command. The first mode register activation signal generation circuit also generates a first mode register activation signal for controlling the mode register set operation of the first electronic chip in response to a first mode register set signal when the first chip identification is identical to the first selection identification.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
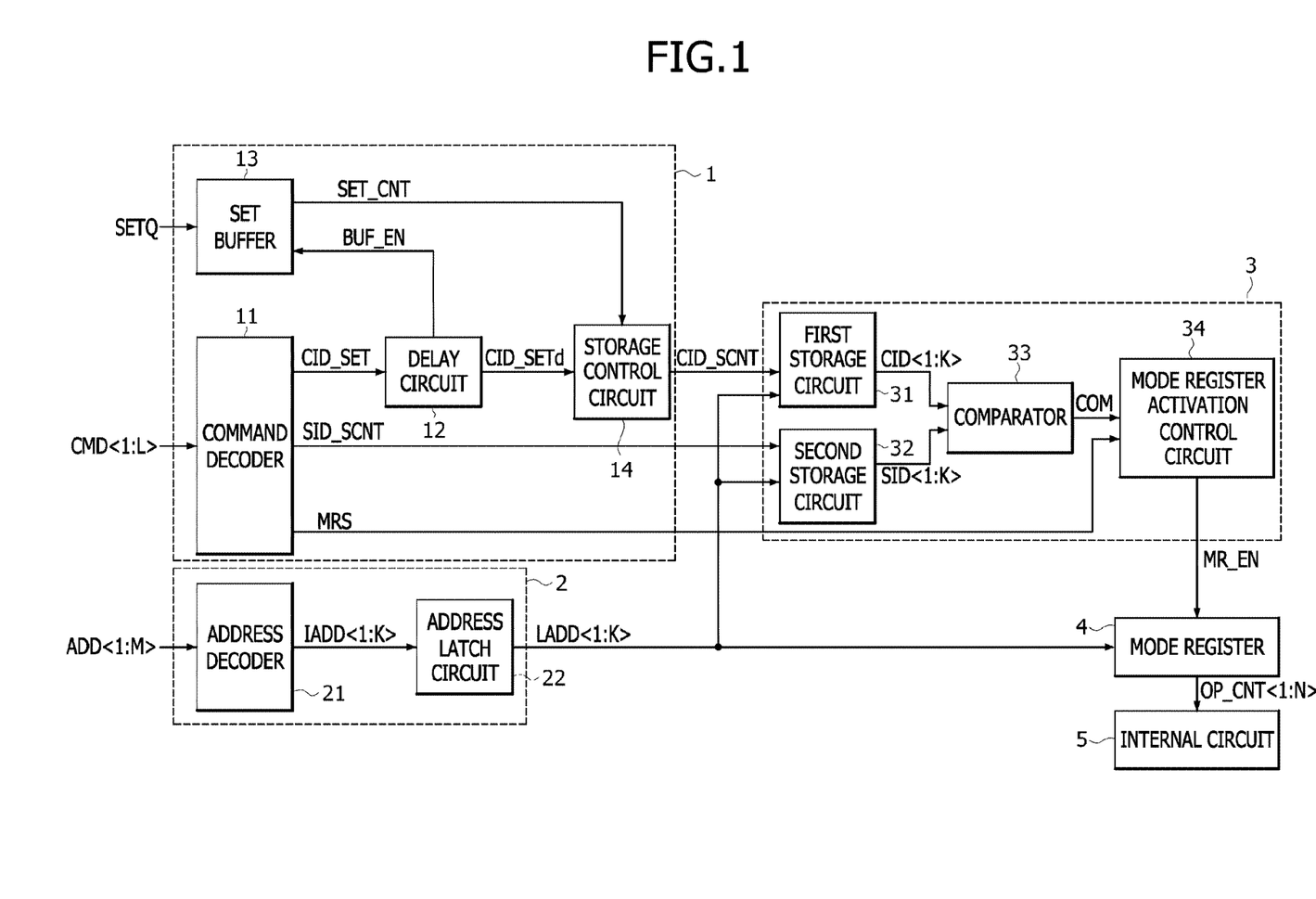
FIG. 1 shows a block diagram illustrating a configuration of a semiconductor device, according to an embodiment of the present disclosure.

As illustrated in FIG. 1, a semiconductor device according to an embodiment of the present teachings may include an operation control circuit 1, an address input circuit 2, a mode register activation signal generation circuit 3, a mode register 4, and an internal circuit 5. The operation control circuit 1 may include a command decoder 11, a delay circuit 12, a set buffer 13, and a storage control circuit 14. The address input circuit 2 may include an address decoder 21 and an address latch circuit 22. The mode register activation signal generation circuit 3 may include a first storage circuit 31, a second storage circuit 32, a comparator 33, and a mode register activation control circuit 34.

Referring to the operation control circuit 1, the command decoder 11 may generate a chip identification set signal CID_SET, a selection identification storage control signal SID_SCNT, and a mode register set signal MRS in response to a command CMD<1:L>. The command decoder 11 may decode the command CMD<1:L> to sequentially generate the chip identification set signal CID_SET, the selection identification storage control signal SID_SCNT, and the mode register set signal MRS. The command decoder 11 may selectively generate one of the chip identification set signal CID_SET, the selection identification storage control signal SID_SCNT, and the mode register set signal MRS according to a logic level combination of the command CMD<1:L>. Logic level combinations of the command CMD<1:L> for generating the chip identification set signal CID_SET, the selection identification storage control signal SID_SCNT, and the mode register set signal MRS may be set differently for different embodiments. The command decoder 11 may generate the selection identification storage control signal SID_SCNT after the chip identification set signal CID_SET is generated. The command decoder 11 may generate the mode register set signal MRS to execute a mode register set operation after the chip identification set signal CID_SET and the selection identification storage control signal SID_SCNT are generated. In the present embodiment, the chip identification set signal CID_SET, the selection identification storage control signal SID_SCNT, and the mode register set signal MRS may be pulse signals. In some other embodiments, the chip identification set signal CID_SET, the selection identification storage control signal SID_SCNT, and the mode register set signal MRS may be level signals.

The delay circuit 12 may generate a buffer activation signal BUF_EN and a delayed chip identification set signal CID_SETd from the chip identification set signal CID_SET. The delay circuit 12 may delay the chip identification set signal CID_SET to generate the buffer activation signal BUF_EN and the delayed chip identification set signal CID_SETd. In the present embodiment, the delay circuit 12 may generate the delayed chip identification set signal CID_SETd after the buffer activation signal BUF_EN is generated. A sequence in which the delay circuit 12 generates the buffer activation signal BUF_EN and the delayed chip identification set signal CID_SETd may be different for different embodiments. In the present embodiment, the buffer activation signal BUF_EN and the delayed chip identification set signal CID_SETd may be generated as pulse signals. In some other embodiments, the buffer activation signal BUF_EN and the delayed chip identification set signal CID_SETd may be generated as level signals. A configuration and an operation of the delay circuit 12 is described more fully below with reference to FIG. 2.

The set buffer 13 may generate a set control signal SET_CNT from an external set signal SETQ in response to the buffer activation signal BUF_EN. The set buffer 13 may buffer the external set signal SETQ to generate the set control signal SET_CNT if the buffer activation signal BUF_EN is enabled. In the present embodiment, the set control signal SET_CNT may be set as a level signal. In other embodiments, the set control signal SET_CNT may be set as a pulse signal. A configuration and an operation of the set buffer 13 is described more fully below with reference to FIG. 3.

The storage control circuit 14 may generate a chip identification storage control signal CID_SCNT from the delayed chip identification set signal CID_SETd in response to the set control signal SET_CNT. The storage control circuit 14 may buffer the delayed chip identification set signal CID_SETd to generate the chip identification storage control signal CID_SCNT if the set control signal SET_CNT is enabled. In the present embodiment, the chip identification storage control signal CID_SCNT may be generated as a pulse signal. In some other embodiments, the chip identification storage control signal CID_SCNT may be generated as a level signal. A configuration and an operation of the storage control circuit 14 is described more fully below with reference to FIG. 4.

Referring to the address input circuit 2, the address decoder 21 may generate an internal address IADD<1:K> from an address ADD<1:M>. The address decoder 21 may decode the address ADD<1:M> to generate the internal address IADD<1:K>. The number 'M' of bits included in the address ADD<1:M> and the number 'K' of bits included in the internal address IADD<1:K> may be set to the same or different values for different embodiments.

The address latch circuit 22 may generate a latched address LADD<1:K> from the internal address IADD<1:K>. The address latch circuit 22 may latch the internal address IADD<1:K> to generate the latched address LADD<1:K>. A configuration and an operation of the address latch circuit 22 is described more fully below with reference to FIG. 5.

Referring to the mode register activation signal generation circuit 3, the first storage circuit 31 may generate a chip identification CID<1:K> from the latched address LADD<1:K> in response to the chip identification storage control signal CID_SCNT. The first storage circuit 31 may store the latched address LADD<1:K> if the chip identification storage control signal CID_SCNT is enabled. The first storage circuit 31 may output the stored latched address LADD<1:K> as the chip identification CID<1:K>. A configuration and an operation of the first storage circuit 31 is described more fully below with reference to FIG. 6.

The second storage circuit 32 may generate a selection identification SID<1:K> from the latched address LADD<1:K> in response to the selection identification storage control signal SID_SCNT. The second storage circuit 32 may store the latched address LADD<1:K> if the selection identification storage control signal SID_SCNT is enabled. The second storage circuit 32 may output the stored latched address LADD<1:K> as the selection identification SID<1:K>. A configuration and an operation of the second storage circuit 32 is described more fully below with reference to FIG. 7.

The comparator 33 may compare the chip identification CID<1:K> with the selection identification SID<1:K> to generate a comparison signal COM. The comparator 33 may generate the comparison signal COM, which is enabled if the chip identification CID<1:K> is identical to the selection identification SID<1:K>. For some embodiments, the chip identification CID<1:K> being identical to the selection identification SID<1:K> means that the chip identification CID<1:K> and the selection identification SID<1:K> have the same combination of logic levels. In the present embodiment, the comparison signal COM may be enabled with a logic "high" level. In some other embodiments, the comparison signal COM may be enabled with a logic "low" level or may be enabled with one or more pulses.

The mode register activation control circuit 34 may generate a mode register activation signal MR_EN from the mode register set signal MRS in response to the comparison signal COM. The mode register activation control circuit 34 may buffer the mode register set signal MRS to generate the mode register activation signal MR_EN if the comparison signal COM is enabled. A configuration and an operation of the mode register activation control circuit 34 is described more fully below with reference to FIG. 8.

The mode register 4 may generate an operation control signal OP_CNT<1:N> from the latched address LADD<1:K> in response to the mode register activation signal MR_EN. The mode register 4 may store the latched address LADD<1:K> if the mode register activation signal MR_EN is enabled. The mode register 4 may store a portion of the data represented by bits included in the latched address LADD<1:K>, according to some embodiments. The mode register 4 may output the stored latched address LADD<1:K> as the operation control signal OP_CNT<1:N>. The number 'N' of bits included in the operation control signal OP_CNT<1:N> may vary with different embodiments. The operation control signal OP_CNT<1:N> may include information on a burst length and a latency of the semiconductor device.

The internal circuit 5 may execute an internal operation in response to the operation control signal OP_CNT<1:N>. The internal circuit 5 may execute the internal operation, such as a read operation or a write operation, on the basis of the information about the burst length and the latency of the semiconductor device.

Figure 2:
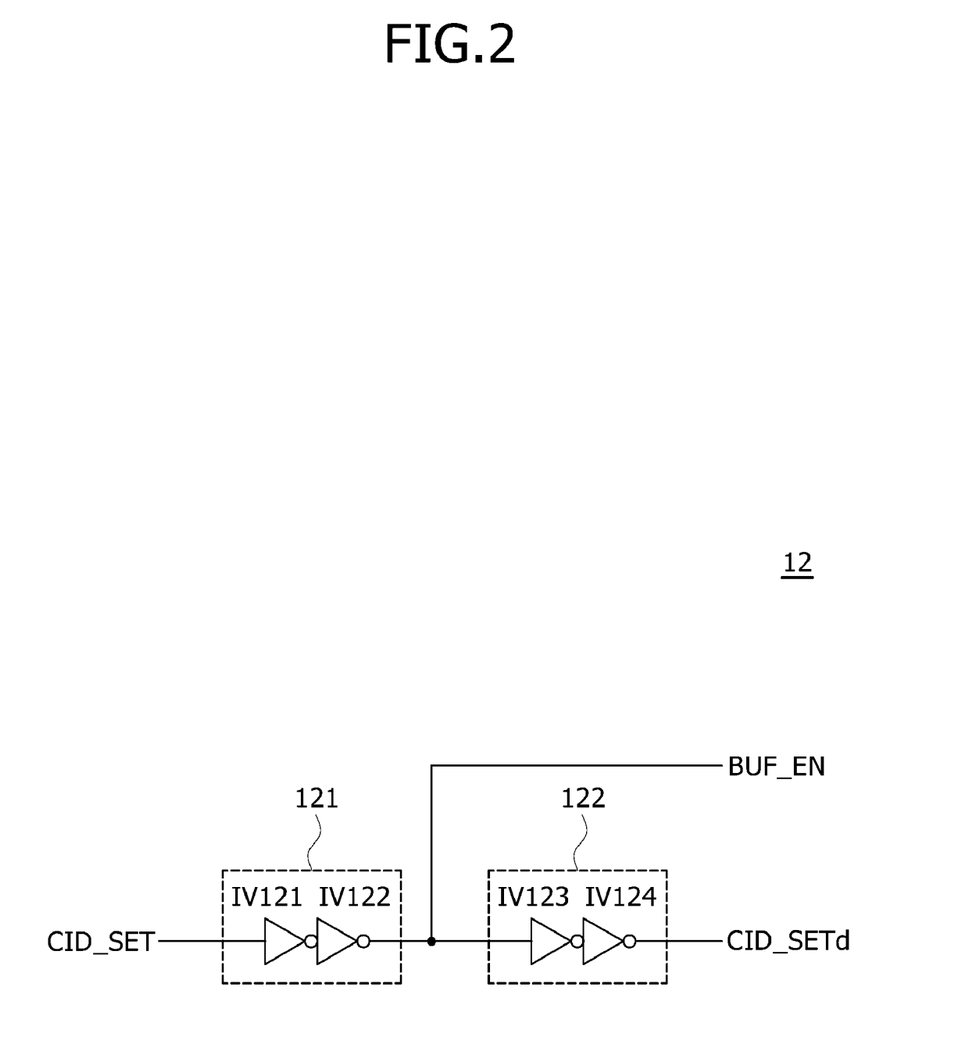
FIG. 2 shows a circuit diagram illustrating an example of a delay circuit included in the semiconductor device of FIG. 1.

Referring to FIG. 2, the delay circuit 12 may include a first delay circuit 121 and a second delay circuit 122. The first delay circuit 121 may include inverters IV121 and IV122, which are cascaded and may delay the chip identification set signal CID_SET to generate the buffer activation signal BUF_EN. The number of inverters included in the first delay circuit 121 may vary with different embodiments. The second delay circuit 122 may include inverters IV123 and IV124 which are cascaded and may delay the buffer activation signal BUF_EN to generate the delayed chip identification set signal CID_SETd. The number of inverters included in the second delay circuit 122 may vary with different embodiments.

Figure 3:
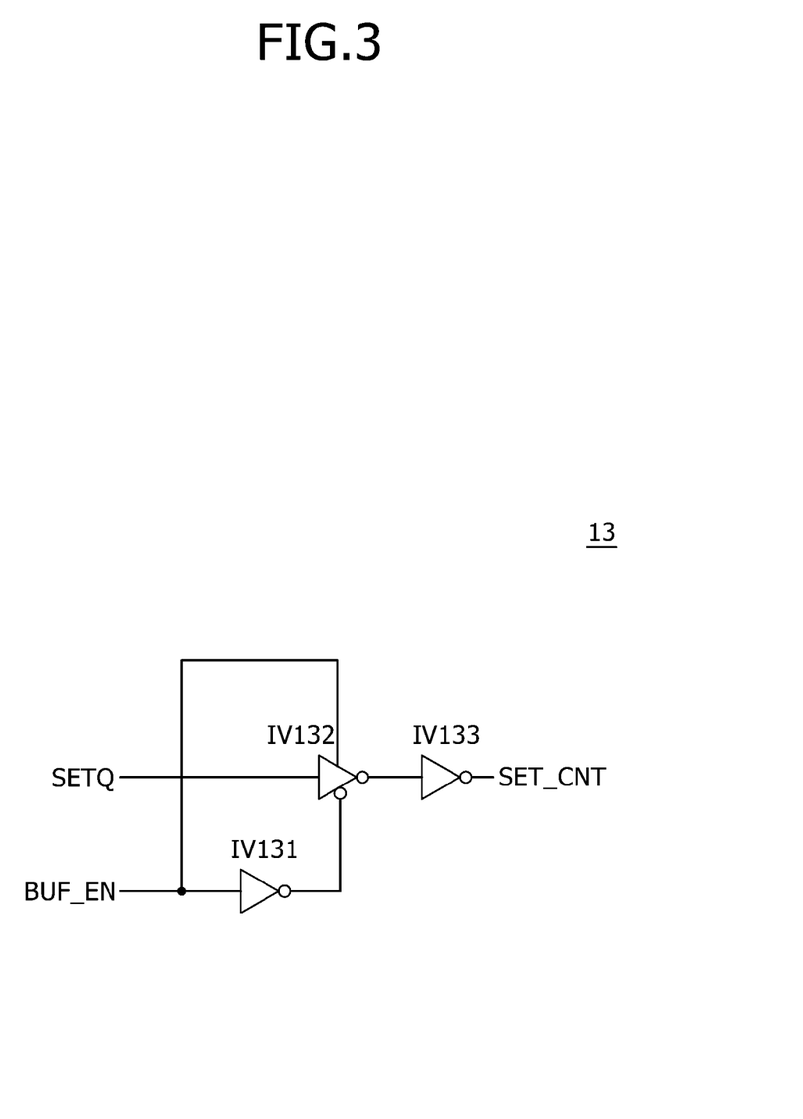
FIG. 3 shows a circuit diagram illustrating an example of a set buffer included in the semiconductor device of FIG. 1.

Referring to FIG. 3, the set buffer 13 may include inverters IV131, IV132, and IV133. The inverter IV131 may inversely buffer the buffer activation signal BUF_EN to output the inversely buffered signal of the buffer activation signal BUF_EN. The inverter IV132 may inversely buffer the external set signal SETQ to output the inversely buffered signal of the external set signal SETQ if the buffer activation signal BUF_EN is enabled with a pulse having a logic "high" level. The inverter IV133 may inversely buffer an output signal of the inverter IV132 to output the inversely buffered signal of the output signal of the inverter IV132 as the set control signal SET_CNT. The set buffer 13 may buffer the external set signal SETQ to generate the set control signal SET_CNT if the buffer activation signal BUF_EN is enabled.

Figure 4:
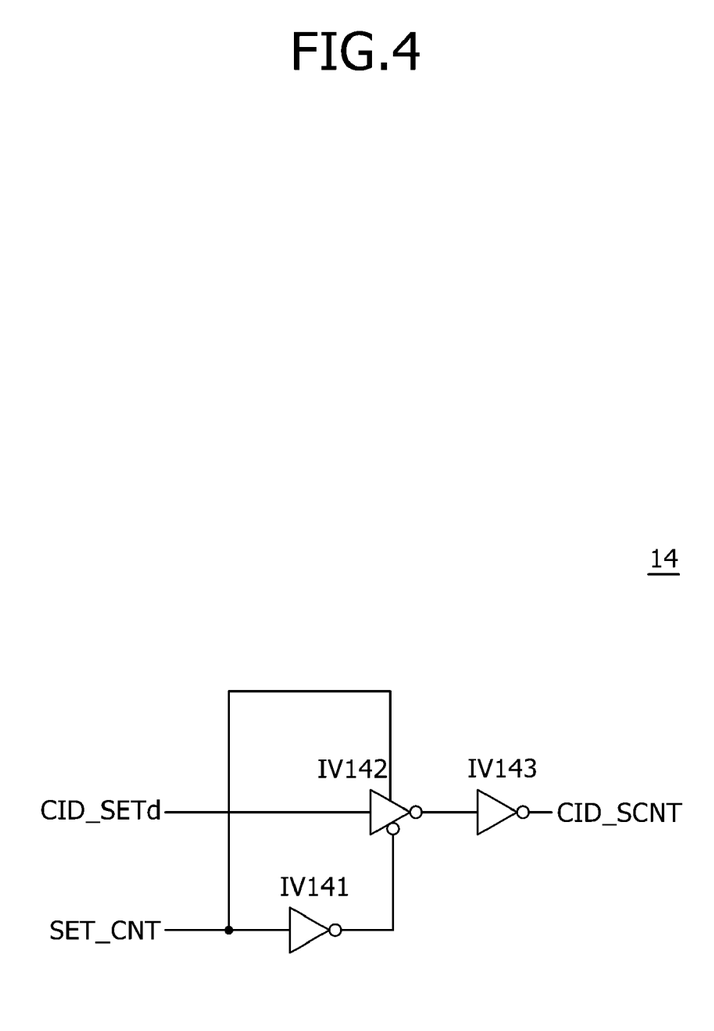
FIG. 4 shows a circuit diagram illustrating an example of a storage control circuit included in the semiconductor device of FIG. 1.

Referring to FIG. 4, the storage control circuit 14 may include inverters IV141, IV142, and IV143. The inverter IV141 may inversely buffer the set control signal SET_CNT to output the inversely buffered signal of the set control signal SET_CNT. The inverter IV142 may inversely buffer the delayed chip identification set signal CID_SETd to output the inversely buffered signal of the delayed chip identification set signal CID_SETd if the set control signal SET_CNT is enabled with a pulse having a logic "high" level. The inverter IV143 may inversely buffer an output signal of the inverter IV142 to output the inversely buffered signal of the output signal of the inverter IV142 as the chip identification storage control signal CID_SCNT. The storage control circuit 14 may buffer the delayed chip identification set signal CID_SETd to generate the chip identification storage control signal CID_SCNT if the set control signal SET_CNT is enabled.

Figure 5:
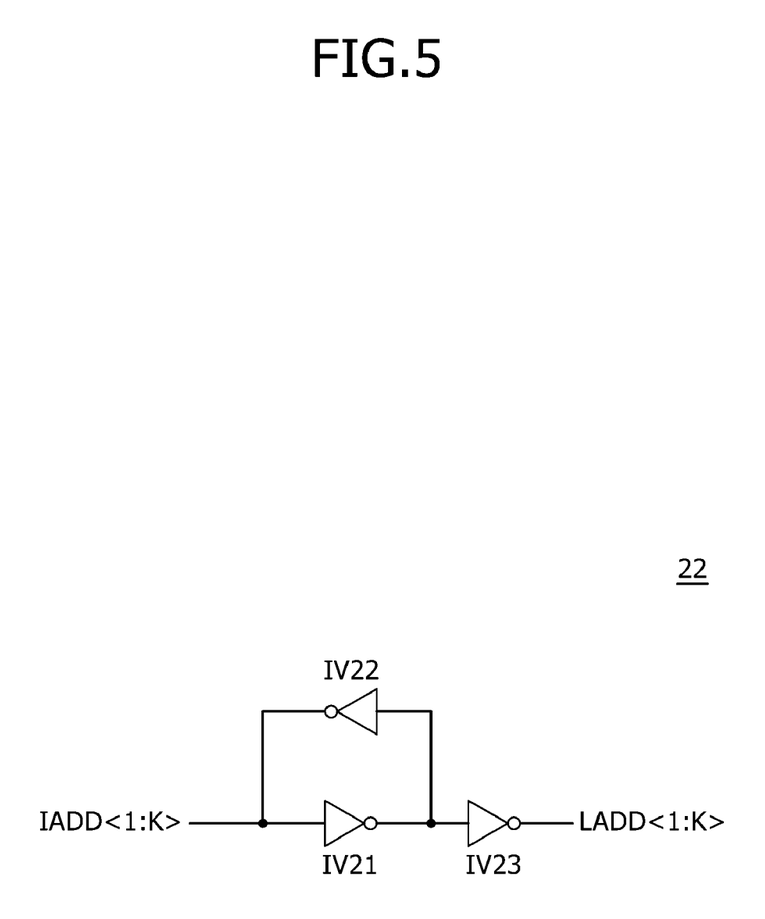
FIG. 5 shows a circuit diagram illustrating an example of an address latch circuit included in the semiconductor device of FIG. 1.

Referring to FIG. 5, the address latch circuit 22 may include inverters IV21, IV22, and IV23. The inverter IV21 may inversely buffer the internal address IADD<1:K> to output the inversely buffered signal of the set internal address IADD<1:K>. The inverter IV22 may inversely buffer an output signal of the inverter IV21 to output the inversely buffered signal of the output signal of the inverter IV21 as the internal address IADD<1:K>. The inverter IV23 may inversely buffer the output signal of the inverter IV21 to output the inversely buffered signal of the output signal of the inverter IV21 as the latched address LADD<1:K>.

Figure 6:
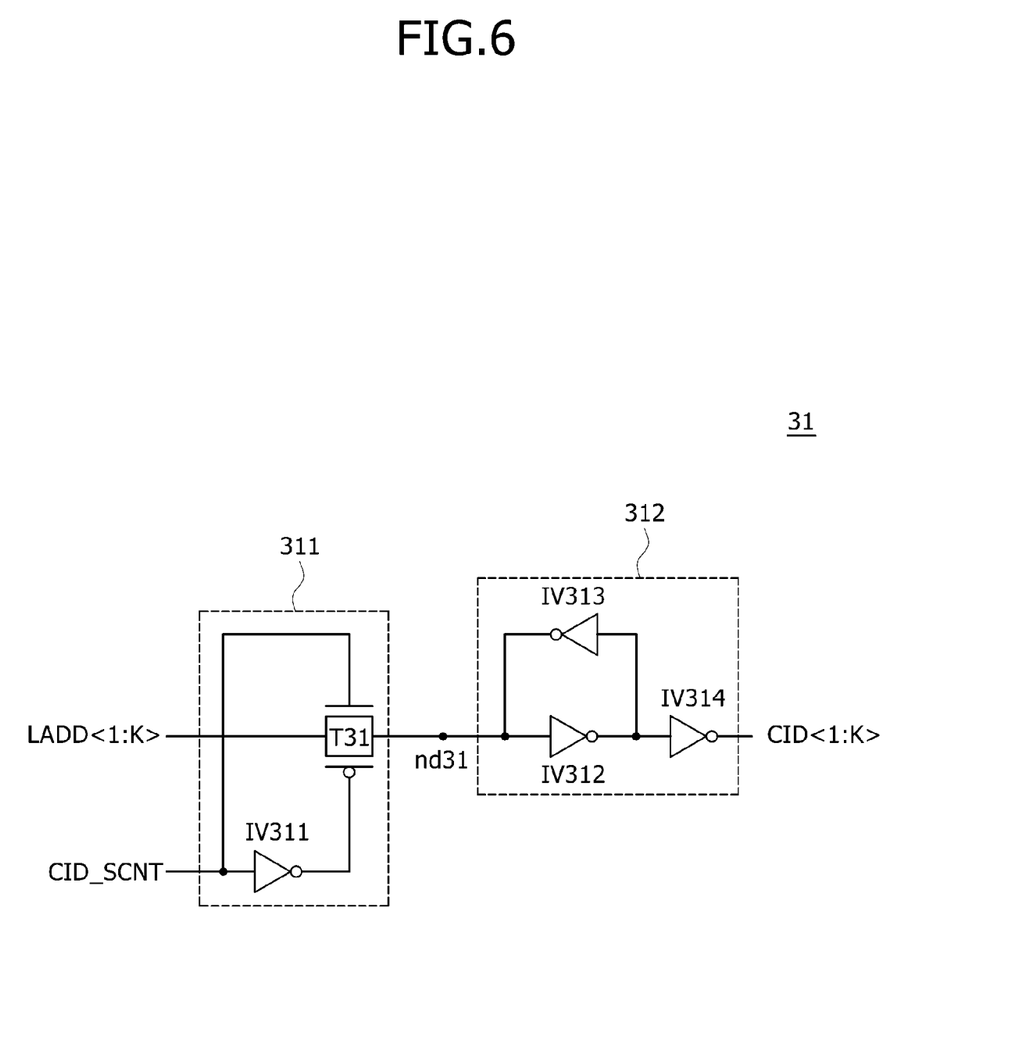
FIG. 6 shows a circuit diagram illustrating an example of a first storage circuit included in the semiconductor device of FIG. 1.

Referring to FIG. 6, the first storage circuit 31 may include a first address input circuit 311 and a first identification output circuit 312. The first address input circuit 311 may include an inverter IV311 and a transfer gate T31. The inverter IV311 may inversely buffer the chip identification storage control signal CID_SCNT to output the inversely buffered signal of the chip identification storage control signal CID_SCNT. The transfer gate T31 may output the latched address LADD<1:K> to a node ND31 if the chip identification storage control signal CID_SCNT has a logic "high" level. The first identification output circuit 312 may include inverters IV312, IV313, and IV314. The inverter IV312 may inversely buffer a signal of the node ND31 to output the inversely buffered signal of the signal of the node ND31. The inverter IV313 may inversely buffer an output signal of the inverter IV312 to feed back the inversely buffered signal of the output signal of the inverter IV312 to the node ND31. The inverter IV314 may inversely buffer the output signal of the inverter IV312 to output the inversely buffered signal of the output signal of the inverter IV312 as the chip identification CID<1:K>.

Figure 7:
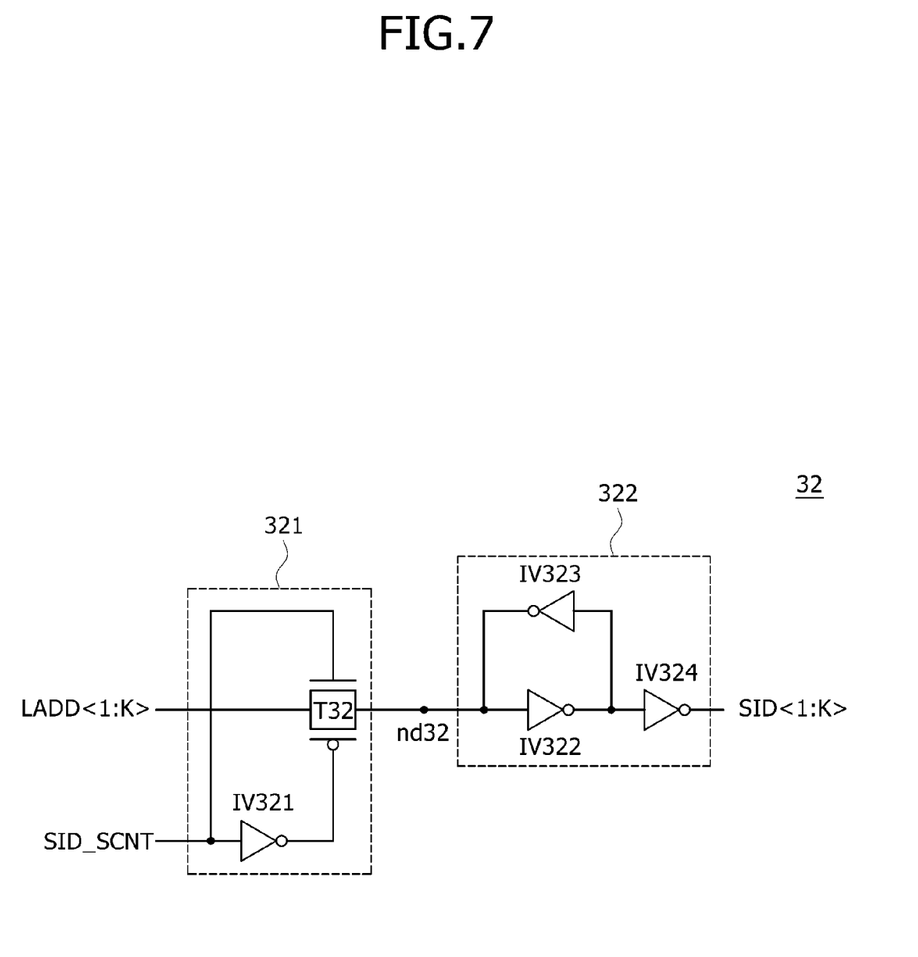
FIG. 7 shows a circuit diagram illustrating an example of a second storage circuit included in the semiconductor device of FIG. 1.

Referring to FIG. 7, the second storage circuit 32 may include a second address input circuit 321 and a second identification output circuit 322. The second address input circuit 321 may include an inverter IV321 and a transfer gate T32. The inverter IV321 may inversely buffer the selection identification storage control signal SID_SCNT to output the inversely buffered signal of the selection identification storage control signal SID_SCNT. The transfer gate T32 may output the latched address LADD<1:K> to a node ND32 if the selection identification storage control signal SID_SCNT has a logic "high" level. The second identification output circuit 322 may include inverters IV322, IV323, and IV324. The inverter IV322 may inversely buffer a signal of the node ND32 to output the inversely buffered signal of the signal of the node ND32. The inverter IV323 may inversely buffer an output signal of the inverter IV322 to feed back the inversely buffered signal of the output signal of the inverter IV322 to the node ND32. The inverter IV324 may inversely buffer the output signal of the inverter IV322 to output the inversely buffered signal of the output signal of the inverter IV322 as the selection identification SID<1:K>.

Figure 8:
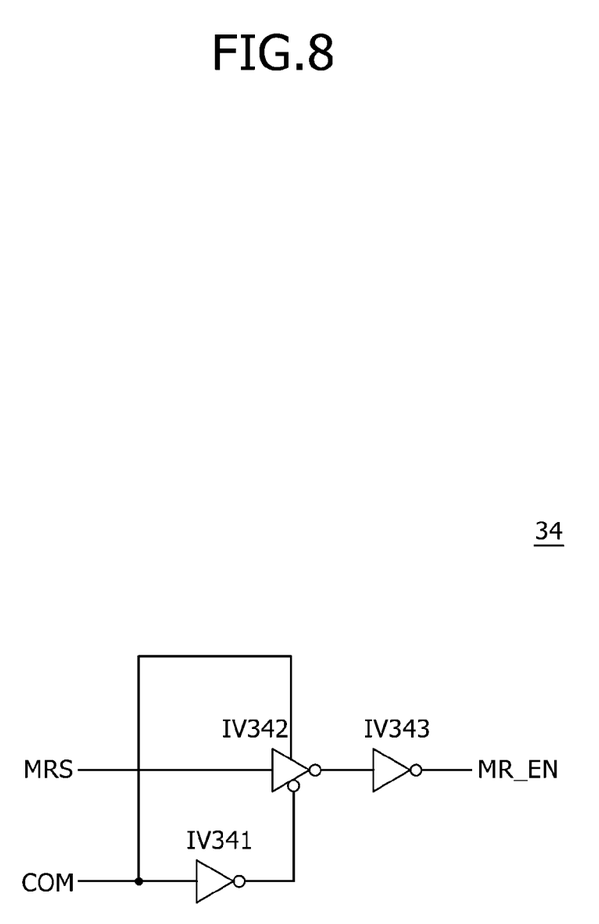
FIG. 8 shows a circuit diagram illustrating an example of a mode register activation control circuit included in the semiconductor device of FIG. 1.

Referring to FIG. 8, the mode register activation control circuit 34 may include inverters IV341, IV342, and IV343. The inverter IV341 may inversely buffer the comparison signal COM to output the inversely buffered signal of the comparison signal COM. The inverter IV342 may inversely buffer the mode register set signal MRS to output the inversely buffered signal of the mode register set signal MRS if the comparison signal COM has a logic "high" level. The inverter IV343 may inversely buffer an output signal of the inverter IV342 to output the inversely buffered signal of the output signal of the inverter IV342 as the mode register activation signal MR_EN. The mode register activation control circuit 34 may buffer the mode register set signal MRS to generate the mode register activation signal MR_EN if the comparison signal COM is enabled to have a logic "high" level.

Figure 9:
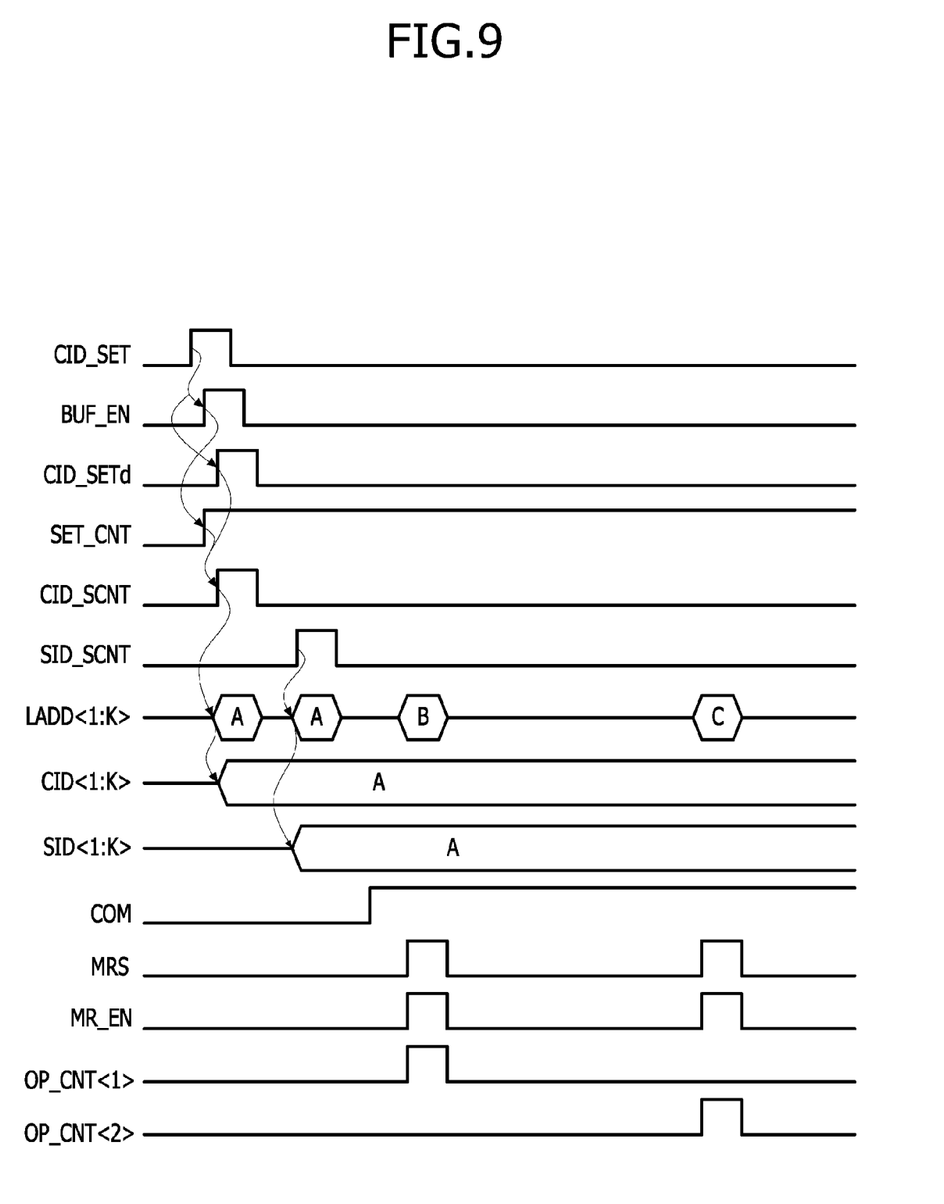
FIG. 9 shows a timing diagram illustrating an operation of the semiconductor device shown in FIG. 1.

An operation of the semiconductor device illustrated by FIGS. 1 through 8 is described with reference to FIG. 9.

First, the buffer activation signal BUF_EN may be enabled in synchronization with the chip identification set signal CID_SET generated by the command decoder 11 to activate the set buffer 13, and the external set signal SETQ may be buffered by the activated set buffer 13 to enable the set control signal SET_CNT. While the set control signal SET_CNT is enabled, the delayed chip identification set signal CID_SETd may be buffered to generate the chip identification storage control signal CID_SCNT. A first logic level combination 'A' of the latched address LADD<1:K> inputted to the first storage circuit 31 in synchronization with a point in time that the chip identification storage control signal CID_SCNT is generated may be stored in the first storage circuit 31 as the chip identification CID<1:K>.

Next, a first logic level combination 'A' of the latched address LADD<1:K> inputted to the second storage circuit 32 in synchronization with the selection identification storage control signal SID_SCNT may be stored in the second storage circuit 32 as the selection identification SID<1:K>. Since the chip identification CID<1:K> and the selection identification SID<1:K> have the same logic level combination as the first logic level combination 'A', the comparison signal COM may be enabled to have a logic "high" level.

Finally, the mode register set signal MRS generated by the command decoder 11 may be outputted from the mode register activation control circuit 34 as the mode register activation signal MR_EN during a period that the comparison signal COM is enabled to the logic "high" level. If the latched address LADD<1:K> having a second logic level combination 'B' is inputted to the mode register 4 while a first one of pulses included in the mode register activation signal MR_EN is generated, a first bit OP_CNT<1> of the operation control signal OP_CNT<1:N> may be generated. If the first bit OP_CNT<1> of the operation control signal OP_CNT<1:N> is generated, an internal operation corresponding to the first bit OP_CNT<1> may be executed. The internal operation corresponding to the first bit OP_CNT<1> may be set to be different according to the embodiments. If the latched address LADD<1:K> having a third logic level combination 'C' is inputted to the mode register 4 while a second one of pulses included in the mode register activation signal MR_EN is generated, a second bit OP_CNT<2> of the operation control signal OP_CNT<1:N> may be generated. If the second bit OP_CNT<2> of the operation control signal OP_CNT<1:N> is generated, an internal operation corresponding to the second bit OP_CNT<2> may be executed. The internal operation corresponding to the second bit OP_CNT<2> may be set to be different according to the embodiments.

Figure 10:
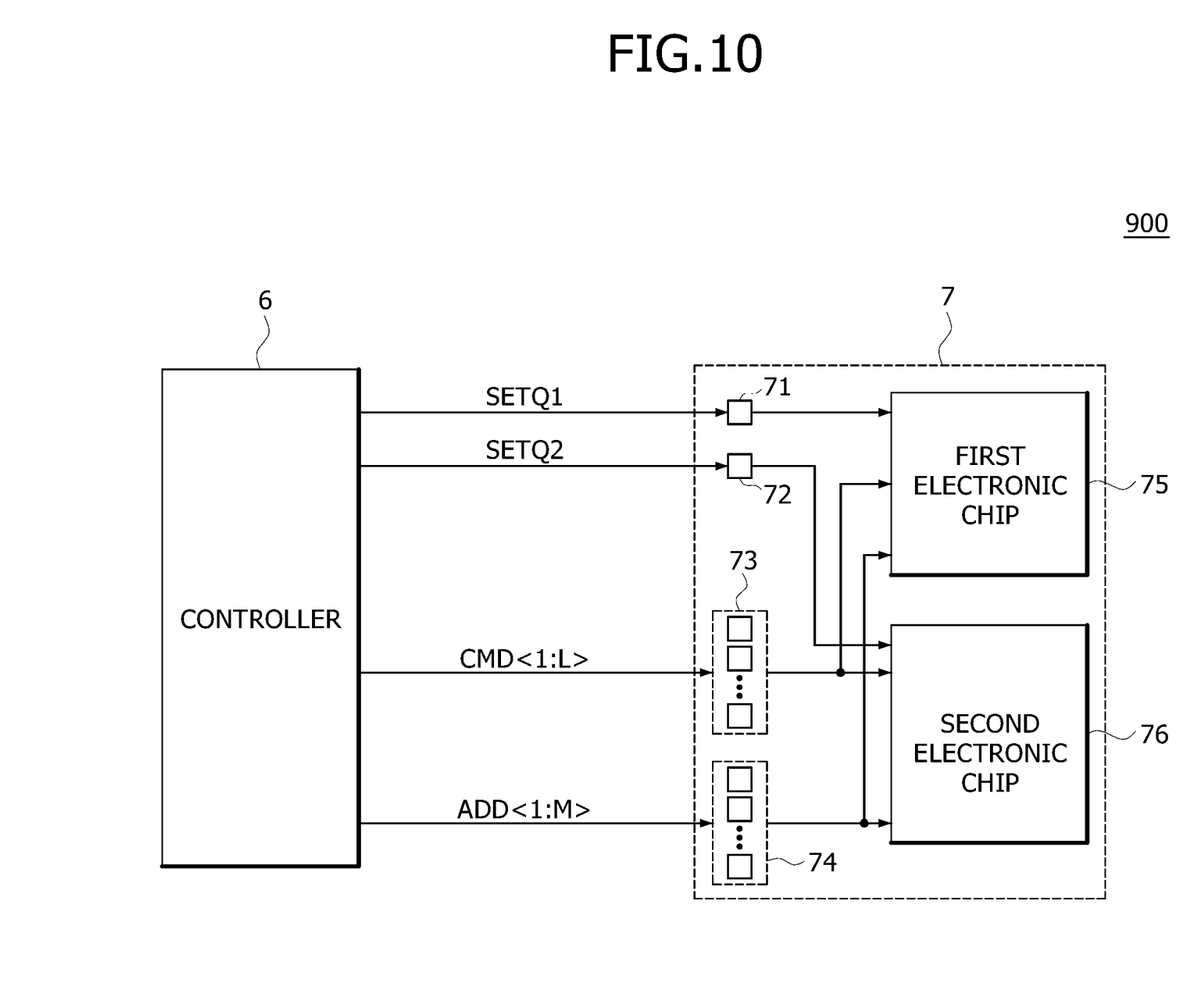
FIG. 10 shows a block diagram illustrating a configuration of a semiconductor system employing the semiconductor device shown in FIG. 1.

The semiconductor device described with reference to FIGS. 1 through 8 may be applied to a semiconductor system, such as a semiconductor system 900 illustrated in FIG. 10. As illustrated in FIG. 10, the semiconductor system 900, according to an embodiment of the present teachings, may include a controller 6 and a semiconductor module 7. The semiconductor module 7 may include a first pad 71, a second pad 72, a command input pad 73, an address input pad 74, a first electronic chip 75, and a second electronic chip 76.

The controller 6 may apply a first external set signal SETQ1, a second external set signal SETQ2, a command CMD<1:L>, and an address ADD<1:M> to the semiconductor module 7 to control mode register set operations of the first and second electronic chips 75 and 76. The first external set signal SETQ1 may be applied to the semiconductor module 7 to store a chip identification of the first electronic chip 75, and the second external set signal SETQ2 may be applied to the semiconductor module 7 to store a chip identification of the second electronic chip 76.

The first electronic chip 75 may receive the first external set signal SETQ1, the command CMD<1:L>, and the address ADD<1:M> through the first pad 71, the command input pad 73, and the address input pad 74, respectively, to store the chip identification and the selection identification and to control the execution or the non-execution of the mode register set operation of the first electronic chip 75 according to whether the chip identification is identical to the selection identification. The first electronic chip 75 may have the same configuration as the semiconductor device illustrated by FIGS. 1 through 8. Thus, a detailed configuration and a detailed operation of the first electronic chip 75 is omitted here.

The second electronic chip 76 may receive the second external set signal SETQ2, the command CMD<1:L>, and the address ADD<1:M> through the second pad 72, the command input pad 73, and the address input pad 74, respectively, to store the chip identification and the selection identification and to control the execution or the non-execution of the mode register set operation of the second electronic chip 76 according to whether the chip identification is identical to the selection identification. The second electronic chip 76 may have the same configuration as the semiconductor device illustrated by FIGS. 1 through 8. Thus, a detailed configuration and a detailed operation of the second electronic chip 76 is omitted here.

Figure 11:
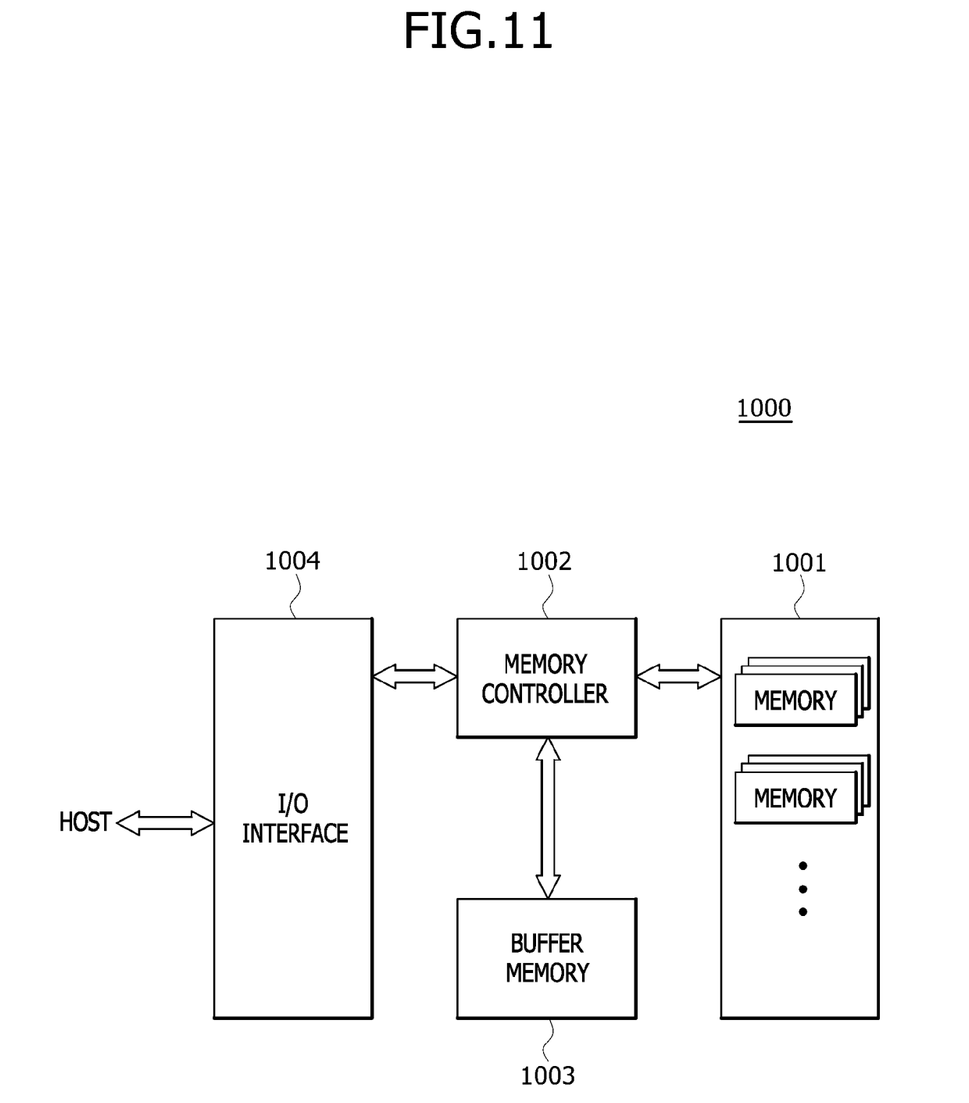
FIG. 11 shows a block diagram illustrating a configuration of an electronic system employing the electronic device shown in FIG. 1.

The semiconductor device described with reference to FIGS. 1 through 8 may also be applied to an electronic system that includes a memory system, a graphic system, a computing system, a mobile system, or the like. For example, as illustrated in FIG. 11, an electronic system 1000 according an embodiment of the present teachings may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal outputted from the memory controller 1002. The data storage circuit 1001 may include the semiconductor device illustrated in FIG. 1. The data storage circuit 1001 may include nonvolatile memory that can retain stored data even when its power supply is interrupted. The nonvolatile memory may be flash memory, such as NOR-type flash memory or NAND-type flash memory, phase change random access memory (PRAM), resistive random access memory (RRAM), spin transfer torque random access memory (STTRAM), magnetic random access memory (MRAM), or the like.

The memory controller 1002 may receive a command outputted from an external device (e.g., a host device)

through the I/O interface 1004 and may decode the command outputted from the host device to control an operation for inputting data into the data storage circuit 1001 or the buffer memory 1003 or for outputting data stored in the data storage circuit 1001 or the buffer memory 1003. Although FIG. 11 illustrates the memory controller 1002 with a single block, the memory controller 1002 may include multiple controllers. For example, the memory controller 1002 may include one controller for controlling the data storage circuit 1001 and another controller for controlling the buffer memory 1003 comprised of volatile memory.

The buffer memory 1003 may temporarily store data to be processed by the memory controller 1002. That is, the buffer memory 1003 may temporarily store data which is outputted from or to be inputted to the data storage circuit 1001. The buffer memory 1003 may store data, which is outputted from the memory controller 1002, according to a control signal. The buffer memory 1003 may read and output stored data to the memory controller 1002. The buffer memory 1003 may include volatile memory, such as a dynamic random access memory (DRAM), mobile DRAM, or static random access memory (SRAM).

The I/O interface 1004 may physically and electrically connect the memory controller 1002 to the external device (i.e., the host). Thus, the memory controller 1002 may receive control signals and data supplied by the external device (i.e., the host) through the I/O interface 1004 and may output data outputted from the memory controller 1002 to the external device (i.e., the host) through the I/O interface 1004. That is, the electronic system 1000 may communicate with the host through the I/O interface 1004. The I/O interface 1004 may include any one of various interface protocols, such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or as an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

As described above, a semiconductor device according to an embodiment of the present teachings may store a chip identification and a selection identification. Further, the semiconductor device may execute a mode register operation for a chip of the semiconductor device when the chip identification for the chip matches the selection identification.

In addition, a speed of the mode register set operation of the semiconductor device may be improved by selecting a chip of the semiconductor device before the mode register set operation is executed.

What is claimed is:

1. A semiconductor device comprising:
an operation control circuit configured to generate a chip identification storage control signal, a selection identification storage control signal, and a mode register set signal in response to an external set signal and a command; and
a mode register activation signal generation circuit configured to generate a chip identification and a selection identification in response to the chip identification storage control signal and the selection identification storage control signal and configured to generate a mode register activation signal for controlling a mode register set operation in response to the mode register set signal when the chip identification is identical to the selection identification.

2. The semiconductor device of claim 1, wherein the operation control circuit is configured to generate the selection identification storage control signal after generating the chip identification storage control signal and is configured to generate the mode register set signal after generating the selection identification storage control signal.

3. The semiconductor device of claim 1, wherein the operation control circuit comprises a command decoder configured to decode the command to sequentially generate a chip identification set signal, the selection identification storage control signal, and the mode register set signal.

4. The semiconductor device of claim 3, wherein the operation control circuit further comprises a set buffer configured to buffer the external set signal to generate a set control signal in response to a buffer activation signal generated from the chip identification set signal.

5. The semiconductor device of claim 4, wherein the operation control circuit further comprises a storage control circuit configured to buffer a delayed chip identification set signal, generated from the chip identification set signal, to generate the chip identification storage control signal in response to the set control signal.

6. The semiconductor device of claim 1, wherein the mode register activation signal generation circuit comprises a first storage circuit configured to store a latched address in response to the chip identification storage control signal and configured to output the stored latched address as the chip identification.

7. The semiconductor device of claim 6, wherein the mode register activation signal generation circuit further comprises a second storage circuit configured to store the latched address in response to the selection identification storage control signal and configured to output the stored latched address as the selection identification.

8. The semiconductor device of claim 7, wherein the mode register activation signal generation circuit further comprises a mode register activation control circuit configured to generate the mode register activation signal from the mode register set signal in response to a comparison signal which is enabled when the chip identification is identical to the selection identification.

9. The semiconductor device of claim 1, further comprising a mode register configured to extract an operation control signal for controlling an internal operation from a latched address and configured to store the operation control signal, in response to the mode register activation signal.

10. A semiconductor device comprising:
a first storage circuit configured to store a latched address in response to a chip identification storage control signal and configured to output the stored latched address as a chip identification;
a second storage circuit configured to store the latched address in response to a selection identification storage control signal and configured to output the stored latched address as a selection identification; and
a mode register activation control circuit configured to generate a mode register activation signal from a mode register set signal in response to a comparison signal which is enabled when the chip identification is identical to the selection identification.

11. The semiconductor device of claim 10, further comprising an operation control circuit configured to generate the selection identification storage control signal after generating the chip identification storage control signal and configured to generate the mode register set signal after generating the selection identification storage control signal.

12. The semiconductor device of claim 11, wherein the operation control circuit comprises a command decoder configured to decode a command to sequentially generate a chip identification set signal, the selection identification storage control signal, and the mode register set signal.

13. The semiconductor device of claim 12, wherein the operation control circuit further comprises a set buffer configured to buffer an external set signal to generate a set control signal in response to a buffer activation signal generated from the chip identification set signal.

14. The semiconductor device of claim 13, wherein the operation control circuit further comprises a storage control circuit configured to buffer a delayed chip identification set signal, generated from the chip identification set signal, to generate the chip identification storage control signal in response to the set control signal.

15. The semiconductor device of claim 10, further comprising a mode register configured to extract an operation control signal, for controlling an internal operation, from a latched address and configured to store the operation control signal, in response to the mode register activation signal.

16. A semiconductor system comprising:
a controller configured to output a first external set signal, a second external set signal, a command, and an address; and
a semiconductor module configured to include a first electronic chip and a second electronic chip that execute mode register set operations in response to the first external set signal, the second external set signal, the command, and the address from the controller,
wherein the first electronic chip comprises a first mode register activation signal generation circuit configured to generate a first chip identification and a first selection identification in response to a first chip identification storage control signal, generated from the first external set signal, and a first selection identification storage control signal, generated from the command, and configured to generate a first mode register activation signal for controlling the mode register set operation of the first electronic chip in response to a first mode register set signal when the first chip identification is identical to the first selection identification.

17. The semiconductor system of claim 16, wherein the first electronic chip comprises:

a first storage circuit configured to store a latched address generated from the address in response to the first chip identification storage control signal and configured to output the stored latched address as the first chip identification;
a second storage circuit configured to store the latched address in response to the first selection identification storage control signal and configured to output the stored latched address as the first selection identification; and
a mode register activation control circuit configured to generate a mode register activation signal from the first mode register set signal in response to a comparison signal which is enabled when the first chip identification is identical to the first selection identification.

18. The semiconductor system of claim 17, wherein the first electronic chip further comprises an operation control circuit configured to generate the first selection identification storage control signal after generating the first chip identification storage control signal and configured to generate the first mode register set signal after generating the first selection identification storage control signal.

19. The semiconductor system of claim 18, wherein the operation control circuit comprises:
a command decoder configured to decode the command to sequentially generate a first chip identification set signal, the first selection identification storage control signal, and the first mode register set signal;
a set buffer configured to buffer the first external set signal to generate a set control signal in response to a buffer activation signal generated from the first chip identification set signal; and
a storage control circuit configured to buffer a first delayed chip identification set signal, generated from the first chip identification set signal, to generate the first chip identification storage control signal in response to the set control signal.

20. The semiconductor system of claim 16, wherein the second electronic chip comprises a second mode register activation signal generation circuit configured to generate a second chip identification and a second selection identification in response to a second chip identification storage control signal, generated from the second external set signal, and a second selection identification storage control signal, generated from the command, and configured to generate a second mode register activation signal for controlling the mode register set operation of the second electronic chip in response to a second mode register set signal when the second chip identification is identical to the second selection identification.

* * * * *